US 6,656,808 B2

(12) United States Patent
Kwean

(10) Patent No.: US 6,656,808 B2
(45) Date of Patent: Dec. 2, 2003

(54) TRANSISTOR HAVING VARIABLE WIDTH GATE ELECTRODE AND METHOD OF MANUFACTURING THE SAME

(75) Inventor: Sung-Un Kwean, Yongin-si (KR)

(73) Assignee: Samsung Electronics Co., Ltd., Suwon (KR)

(*) Notice: Subject to any disclaimer, the term of this patent is extended or adjusted under 35 U.S.C. 154(b) by 184 days.

(21) Appl. No.: 09/945,723

(22) Filed: Sep. 5, 2001

(65) Prior Publication Data
US 2002/0027254 A1 Mar. 7, 2002

(30) Foreign Application Priority Data
Sep. 5, 2000 (KR) .......................... 2000-52252

(51) Int. Cl.[7] .......................... H01L 21/8242
(52) U.S. Cl. .................. 438/305; 438/585; 438/978; 257/408
(58) Field of Search ................. 438/305, 585, 438/978, FOR 188, FOR 458, FOR 492; 257/408, 29.135

(56) References Cited

U.S. PATENT DOCUMENTS

| 5,742,363 A | * 4/1998 | Bae ....................... 349/38 |
| 5,877,530 A | * 3/1999 | Aronowitz et al. ......... 257/344 |
| 5,933,717 A | * 8/1999 | Hause et al. ............... 438/200 |
| 5,937,299 A | * 8/1999 | Michael et al. ............ 438/299 |
| 6,018,179 A | * 1/2000 | Gardner et al. ............ 257/336 |
| 6,037,630 A | * 3/2000 | Igarashi et al. ............ 257/336 |
| 6,060,375 A | * 5/2000 | Owyang et al. ............ 438/585 |
| 6,096,641 A | * 8/2000 | Kunikiyo ................... 438/653 |
| 6,107,148 A | * 8/2000 | Taki ......................... 438/303 |
| 6,136,657 A | * 10/2000 | Yang et al. ................ 438/303 |
| 6,169,315 B1 | * 1/2001 | Son .......................... 257/408 |
| 6,197,645 B1 | * 3/2001 | Michael et al. ............ 438/300 |
| 6,207,995 B1 | * 3/2001 | Gardner et al. ............ 257/344 |
| 6,348,385 B1 | * 2/2002 | Cha et al. .................. 438/287 |
| 6,433,371 B1 | * 8/2002 | Scholer et al. ............. 257/288 |
| 6,465,334 B1 | * 10/2002 | Buynoski et al. .......... 438/591 |

FOREIGN PATENT DOCUMENTS

| JP | 62-52968 | * 3/1987 | .............. 438/297 |
| JP | 63-185064 | * 7/1988 | .............. 438/158 |
| JP | 2-196434 | * 8/1990 | .............. 438/227 |

* cited by examiner

Primary Examiner—George Fourson
Assistant Examiner—Joannie Adelle Garcia
(74) Attorney, Agent, or Firm—Volentine Francos, PLLC

(57) ABSTRACT

A transistor includes a substrate and a gate electrode formed on the substrate and having a wider upper portion than lower portion. A spacer is formed on the side wall of the gate electrode from the upper portion to the lower portion of the gate electrode. A first impurity doped region is formed at an upper portion of the substrate and a second impurity doped region having a higher concentration is formed at a narrower and deeper region than the first impurity doped region.

20 Claims, 17 Drawing Sheets

TRANSISTOR HAVING VARIABLE WIDTH GATE ELECTRODE AND METHOD OF MANUFACTURING THE SAME

BACKGROUND OF THE INVENTION

1. Field of the Invention

The present invention relates to a transistor and a method of manufacturing the same, and more particularly, to a transistor having an enlarged gate area at an upper portion thereof to achieve a stabilized electrode size, and an advantageous method of manufacturing the same.

2. Description of the Related Art

The elements of a semiconductor device are becoming more densely integrated to improve the processing speed and increase the memory capacity. Manufacturing processes for 16 M and 64 M dynamic random access memory (DRAM) devices are being replaced by 256 M manufacturing processes, and mass production techniques for 1 G devices are rapidly evolving. However, with increases in processing speed and memory capacity, the manufacturing techniques to produce the devices must take into account certain manufacturing limitations in the pursuit of delivering increasingly complex and integrated devices.

A semiconductor device is generally manufactured by forming a multi-layer structure, including dielectric layers and conductive layers, and with minute patterns having a design rule of 0.15 μm or less. One of the most important goals in semiconductor design is to increase the speed of the device, which typically means reducing the size of a gate of a transistor. However, manufacturing a device having a feature size of 100 nm or less by utilizing present photolithography patterning techniques is very difficult. Accordingly, a method utilizing an SiON hard mask has been utilized to reduce the size of the gate.

FIGS. 1A–1H are schematic cross-sectional views explaining a method of manufacturing a transistor according to the conventional SiON method.

Referring to FIG. 1A, a gate oxide layer 110 having a thickness of about 100–150 Å is formed on a semiconductor substrate 100. On the gate oxide layer 110, polysilicon is deposited to a thickness of about 2500 Å to form a polysilicon layer 120, and then SiON is deposited on the polysilicon layer to a thickness of about 800 Å to form an anti-reflective layer 130. The anti-reflective layer 130 is applied in those cases where the reflectivity of an underlying layer is high, when the step coverage of the underlying layer is great, or when the critical dimension of a pattern is very small. On the anti-reflective layer 130, a photoresist is coated and then is patterned by a photolithography to form a photoresist pattern 142.

Referring to FIG. 1B, a SiON pattern 132 is formed by patterning and etching a second photoresist pattern 144, which has a reduced size when compared with the photoresist pattern 142. A dry etching process utilizing $O_2$ may be used to form the SiON pattern 132. Generally, the photoresist is mainly composed of carbon and hydrogen, and so, the photoresist pattern is advantageously etched by oxygen, while forming $CO_2$, CO, $H_2O$, and the like.

Referring to FIG. 1C, the photoresist pattern 144 is removed by a strip method to form a hard mask using the SiON pattern 132 (hereinafter, referred to as SiON hard mask). The hard mask functions as an etching mask even though it is not the photoresist pattern. However, the hard mask has a higher etching selectivity than that of the photoresist pattern.

Referring to FIG. 1D, the underlying polysilicon layer 120 is etched to form a polysilicon pattern 122 by utilizing the SiON hard mask 132. In order to etch the polysilicon, a mixture of carbon tetrachloride and argon gas, a mixture of carbon tetrafluoride and oxygen gas, $CF_3Cl$ gas, a mixture of carbon fluoride-based compound and chlorine gas, etc. can be utilized.

Referring to FIG. 1E, the SiON hard mask 132 is removed and then an impurity doping process is performed utilizing the recently formed gate electrode 122 as a mask. A LDD (lightly doped drain) 102a is formed by doping an impurity having a low concentration.

Referring to FIG. 1F, a SiN layer is deposited and then an etch back process is implemented to form a spacer 150 on the side walls of the oxide pattern 122. A HDD (heavily doped drain) 102b is formed by doping an impurity having a high concentration and using the SiN spacer 150 as a mask.

Referring to FIG. 1G, a cobalt layer 160 is formed by depositing cobalt (Co) on the whole surface of the gate electrode on which the spacer 150 is formed.

Referring to FIG. 1H, a heat treatment process is performed under a temperature range of about 700–900° C. so that the deposited cobalt reacts with the Si atoms on the underlying layer to form a CoSix compound. That is, a silicidation process is completed by respectively forming CoSix layers 124 and 114 on the oxide pattern and the substrate, except for the region where the SiN spacer 150 is formed.

By implementing a salicidation (i.e., a self-aligned silicide) process, a silicide compound can be selectively formed on a desired region. When metal compounds such as Ti, Ni, Co, etc. are deposited on a layer containing a silicon atom, and a heat treatment process is then performed, a silicide compound such as Ti-silicide, Ni-silicide or Co-silicide is formed by the interaction. After forming a dielectric layer on the silicide layer and then forming a contact hole by pattering the dielectric layer, this silicide layer can be advantageously exposed (self-aligned property). When a metallic layer is formed on the dielectric layer, the metallic layer advantageously makes contact with the silicon containing lower layer through the contact hole. Accordingly, this salicidation process is applied when manufacturing a device having a minute critical dimension.

According to the above-described method, a gate electrode having a critical dimension of about 0.10 μm can be obtained. However, certain problems result when the photoresist layer is etched by using $O_2$ as shown in FIG. 1B, since homogeneous etching is difficult because of the small pattern size.

In addition, when manufacturing a transistor with a gate electrode having a size of 0.13 μm or less, a spacer is generally formed on a side wall of the gate electrode and then the silicidation process is implemented to lower the resistance of the gate electrode. At this time, the polysilicon which forms the gate electrode has a compressive stress, and the SiN compound which forms the spacer has a tensile stress, which act counter to each other. Accordingly, the metal silicide compound formed on the gate electrode receives the tensile stress of the SiN spacers formed on the side walls of the gate electrode, which stresses are confronting each other from opposite spacer directions.

U.S. Pat. No. 5,734,185 discloses a method of manufacturing a stabilized and minute gate electrode and a transistor having a gate electrode where a longitudinal length at the upper portion is longer than that at the lower portion which contacts an underlying channel region. By employing this patented method, the number of the photolithography processes for manufacturing the transistor is reduced and so the number of the masks is reduced. In addition, the capacitance of the source-drain is reduced to improve the operating efficiency of the circuit. However, it is understood that the process for the manufacture of the transistor is complicated and the formation of the channel is not advantageous.

SUMMARY OF THE INVENTION

In view of the shortcomings in the conventional art described above, it is an object of the present invention to provide a stable and minute transistor having a gate electrode in which an upper horizontal width is greater than a lower horizontal width.

Another object of the present invention is to provide a method of manufacturing a transistor in which the production costs and processing time are reduced by utilizing just one photolithography process, and thereby reducing the number of the required masks.

To accomplish the first object, the present invention provides a transistor including a substrate and a gate electrode formed on the substrate. The gate electrode has an upper portion and a lower portion, where a horizontal width of the upper portion is greater than a horizontal width of a lower portion. A spacer is formed along the side wall of the gate electrode from the upper portion to the lower portion. A first impurity doped region is formed at an upper portion of the substrate, and a second impurity doped region is formed underlying the first impurity doped region. The second impurity doped region has a impurity concentration higher than the first impurity doped region, and the second impurity doped region is narrower than the first impurity doped region.

Preferably, the ratio of the horizontal width of the upper portion and the horizontal width of the lower portion of the gate electrode is in a range of about 1.3–2.5:1, the horizontal width of the lower portion of the gate electrode is about 0.13 $\mu$m or less, and the height of the gate electrode is in a range of about 1500–2500 Å. More preferably, a metal silicide compound is formed on the gate electrode and the substrate.

Another object of the present invention is accomplished by providing a method of manufacturing a transistor. First, a gate electrode is formed on a substrate, with the gate electrode having an upper portion and a lower portion, and wherein a horizontal width of the upper portion is greater than a horizontal width of the lower portion. A first impurity doped region is formed in the substrate by doping a first impurity having a low concentration and using the gate electrode as a mask. Then a spacer composed of a nitride compound is formed along the entire side wall of the gate electrode. A second impurity doped region is formed in the substrate by doping a second impurity having a higher concentration than that of the first impurity, and using the spacer as a mask.

Preferably, the gate electrode is manufactured by forming, sequentially, a nitride layer, an oxide layer and a photoresist pattern on the substrate. Then, an oxide pattern is formed by etching the oxide layer using the photoresist pattern as a mask, wherein the etching exposes the nitride layer. A sacrificial spacer is then formed on a side wall of the oxide pattern. The exposed portion of the nitride layer between the sacrificial spacer is removed to expose the substrate. A thermal oxide layer is formed on the exposed portion of the substrate between the sacrificial spacer, and a polysilicon layer is deposited on the whole surface of the substrate and the oxide layer. The polysilicon layer is then planarized, and the sacrificial spacer and oxide layer are removed to realize the gate electrode structure.

The sacrificial spacer may be formed by depositing the same material as the oxide layer and implementing an etch back process until the nitride layer is exposed.

The planarization can be implemented by etching back the polysilicon to a predetermined thickness. In an alternate embodiment, the planarization may be implemented by a CMP (chemical mechanical polishing) process. If CMP is used, a nitride pattern is formed by forming another nitride layer on the oxide layer and then etching this additional nitride layer using the photoresist pattern as a mask. Then, the CMP process is implemented using the nitride layer as an etch stopping layer.

More preferably, a metal silicide compound is formed on the gate electrode and the substrate by depositing at least one metal selected from the group consisting of Co, Ti and Ni on the substrate, and then, implementing a heat treating process after implementing the second impurity doping step.

In the present invention, a transistor having a gate electrode having a wider upper portion than the lower portion thereof is advantageously manufactured, providing a stabilized transistor having a minute critical dimension.

BRIEF DESCRIPTION OF THE DRAWINGS

The above objects and advantages of the present invention will become more apparent by describing preferred embodiments in detail with reference to the attached drawings in which:

FIGS. 3A–3I are schematic cross-sectional views illustrating a first method of manufacturing the transistor illustrated in FIG. 2 according to an embodiment of the present invention;

DESCRIPTION OF THE PREFERRED EMBODIMENT

Figure 1A:
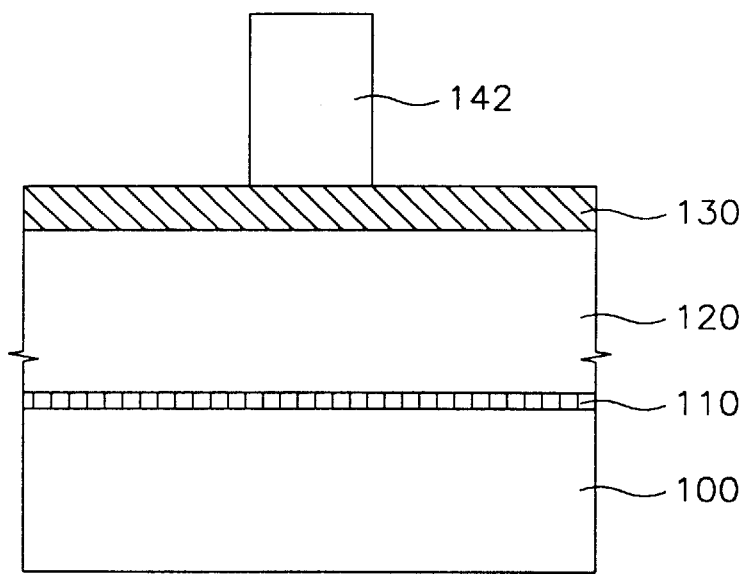
FIGS. 1A–1H are schematic cross-sectional views illustrating a method of manufacturing a transistor according to the conventional method.
Figure 1B:
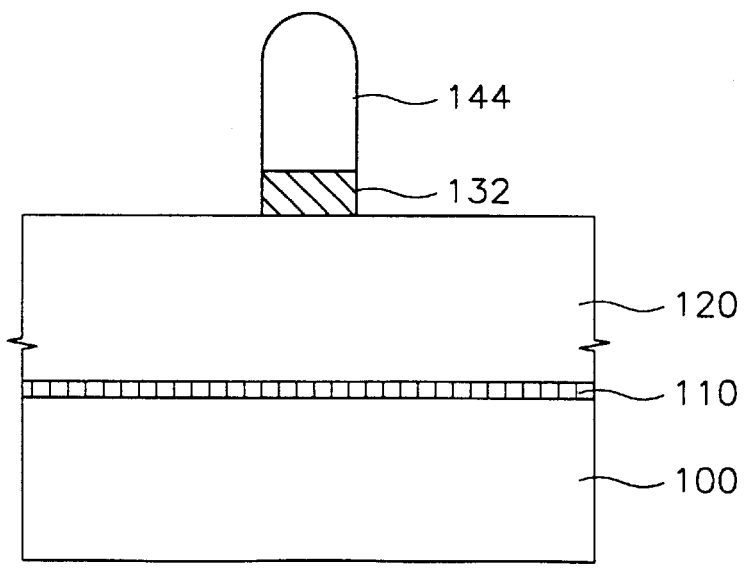
Figure 1C:
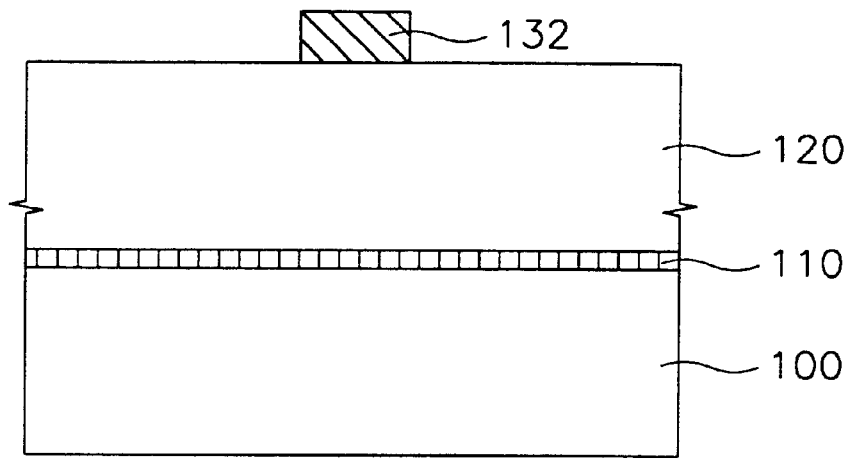
Figure 1D:
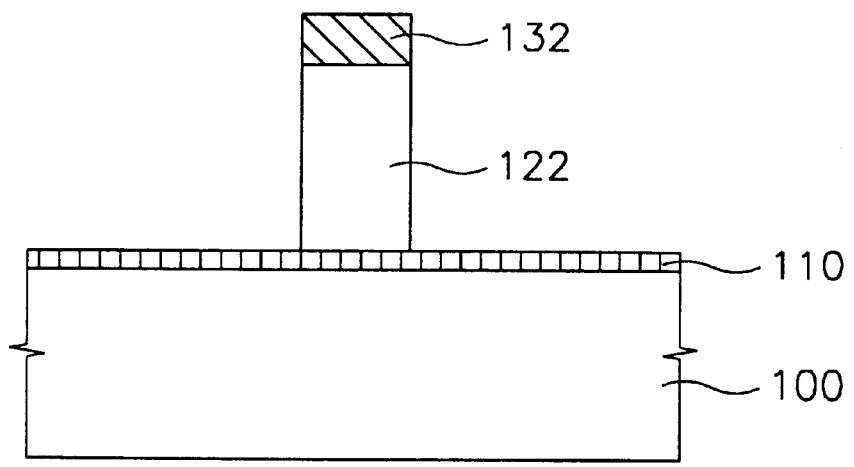
Figure 1E:
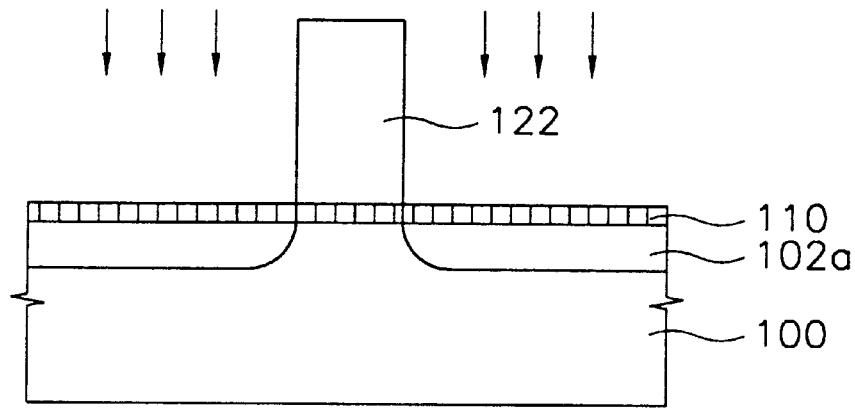
Figure 1F:
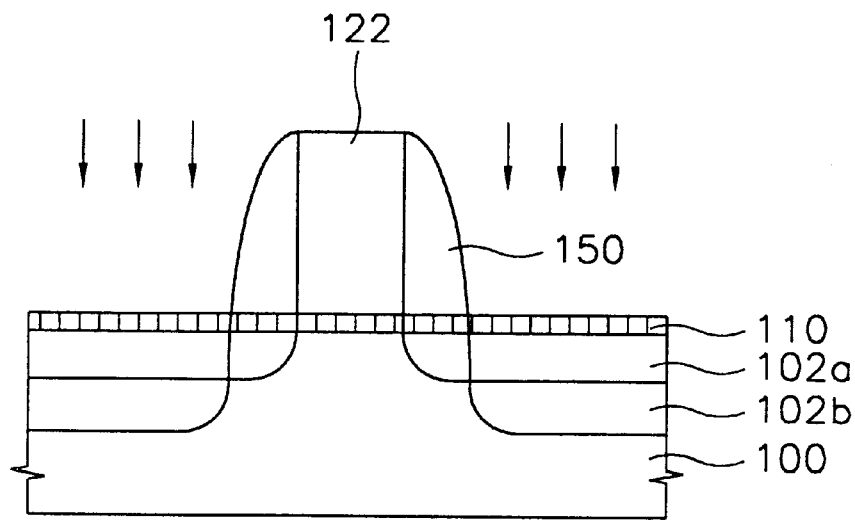
Figure 1G:
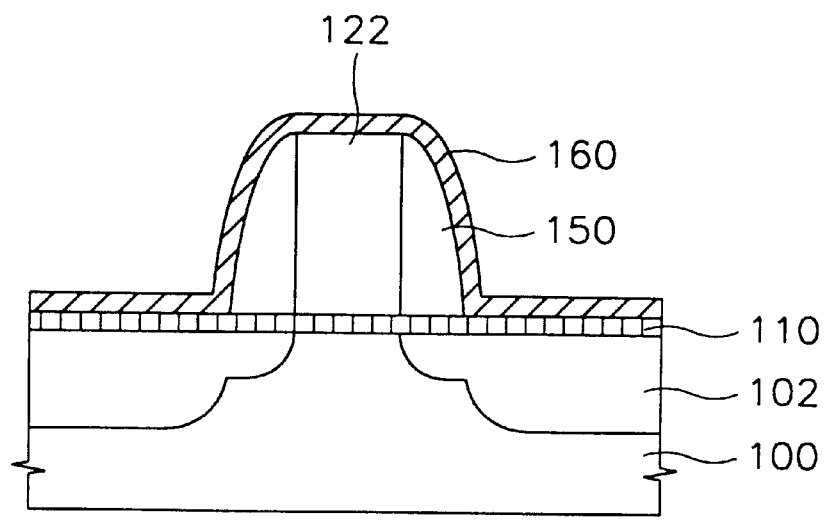
Figure 1H:
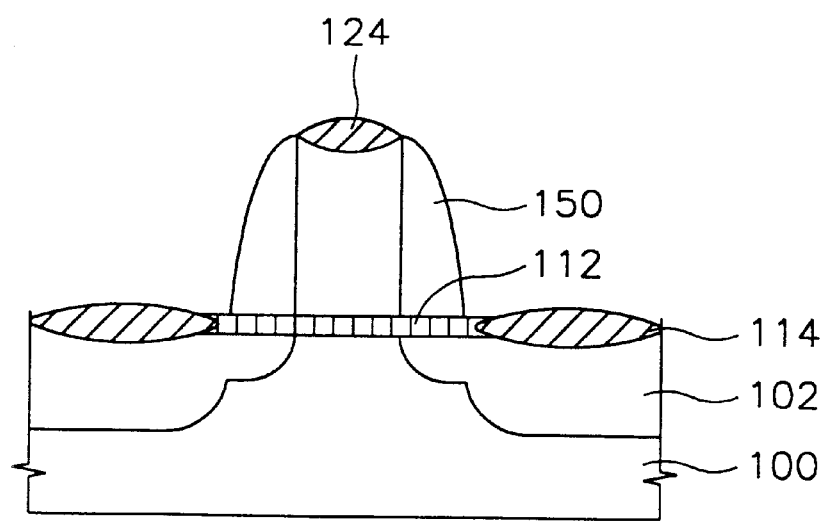

The present invention now will be described more fully with reference to the accompanying drawings, in which preferred embodiments of the invention are shown. The invention may, however, be embodied in many different forms and should not be construed as being limited to the embodiments set forth herein; rather, these embodiments are provided so that this disclosure will be thorough and complete, and will fully convey the concept of the invention to those skilled in the art. In the drawings, the thickness of layers and regions are exaggerated for clarity. It will also be understood that when a layer is referred to as being "on" another layer or substrate, it can be directly on the other layer or substrate, or intervening layers may also be present.

Figure 2:
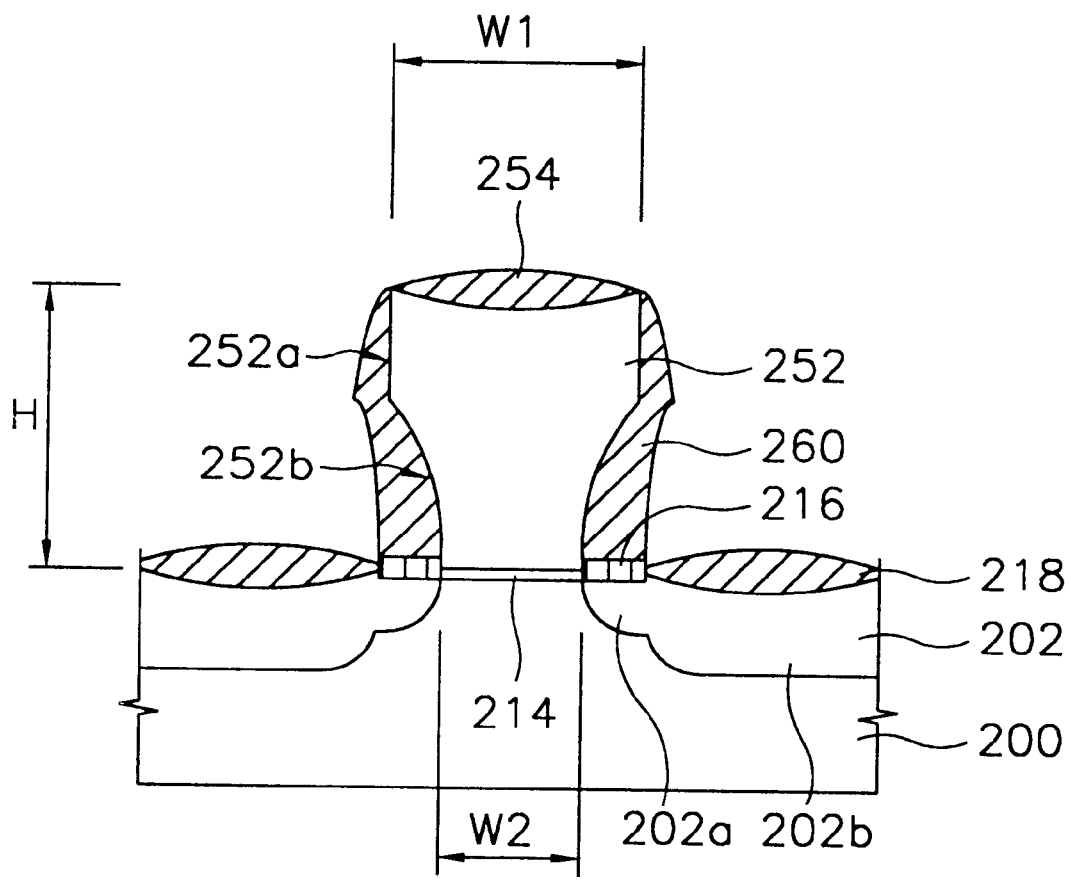
FIG. 2 is a cross-sectional view of a transistor according to an embodiment of the present invention.

FIG. 2 is a cross-sectional view of a transistor according to an embodiment of the present invention. On a substrate 200, a gate oxide 214 which is a thermal oxide layer, and a SiN layer pattern 216 which is made from a nitride layer, are formed. On the gate oxide layer 214, a gate electrode 252 is formed. A SiN spacer 260 is formed along both the upper side wall portion 252a and the lower side wall portion 252b of the gate electrode 252, and the SiN layer pattern 216. Preferably, the ratio of the width W1 of the upper side wall portion 252a and the width W2 of the lower side wall portion 252b of the gate electrode is in a range of about 1.3–2.5:1, the width W2 of the lower side wall portion of the gate electrode is about 0.13 μm or less, and the height H of the gate electrode 252 is in a range of about 1500–2500 Å.

Metal silicide compounds 254 and 218 are formed on a layer including silicon, that is, on the gate electrode 252 and on the substrate 200. Further, at the upper portion of the substrate 200, and adjacent both sides (right and left) of the gate electrode 252, an impurity-doped region 202 including a lightly-doped region 202a and a heavily-doped region 202b, are formed.

FIGS. 3A–3I are schematic cross-sectional views illustrating a method of manufacturing the transistor illustrated in FIG. 2 according to a first embodiment of the present invention.

Figure 3A:
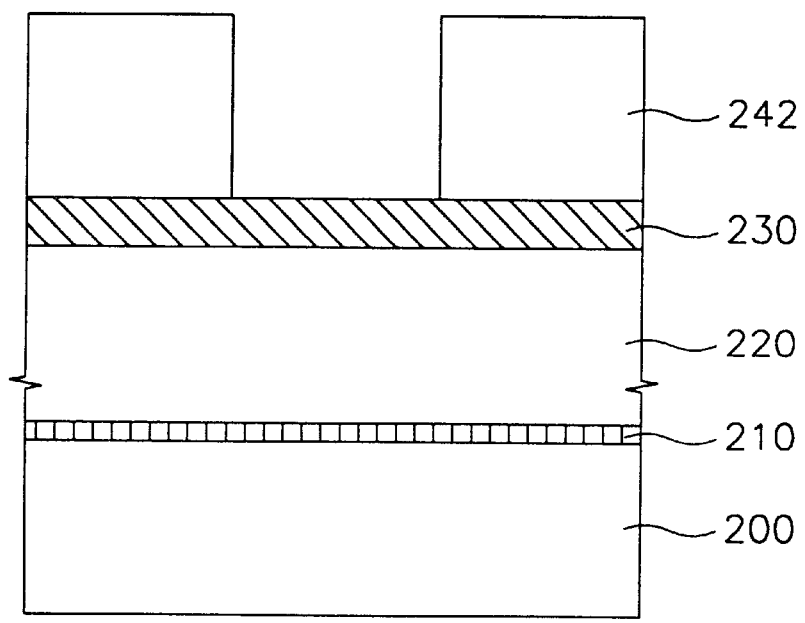

Referring to FIG. 3A, a first nitride layer 210, an oxide layer 220, and a second nitride layer 230 are formed on a substrate 200 by sequentially depositing a nitride compound such as SiN, an oxide compound such as silicon oxide, HTO, $Al_2O_3$, etc., preferably $SiO_2$, and a nitride compound such as SiN and SiON, preferably SiN. Preferably, a first SiN layer 210 having a thickness in a range of about 50–200 Å, a $SiO_2$ layer 220 having a thickness in a range of 1000–4000 Å, and a second SiN layer 230 having a thickness in a range of about 300–1500 Å, are formed. On the second SiN layer 230, a photoresist is coated and a photoresist pattern 242 having a predetermined shape is formed by a photolithography process.

Figure 3B:
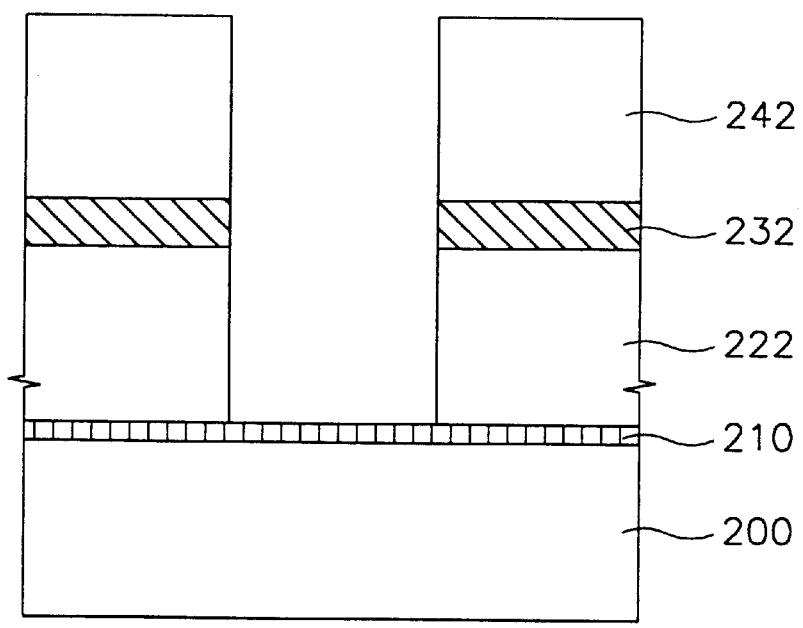

Referring to FIG. 3B, an SiN pattern 232 and an $SiO_2$ pattern 222 are formed by etching the second SiN layer 230 and the $SiO_2$ layer 220 using the photoresist pattern 242 as a mask. To prevent the first SiN layer 210 from being etched, a dry etching process utilizing an etching gas such as $C_4F_8$/Ar/CO is implemented so as to control the etching selectivity of SiN with respect to $SiO_2$, for example in a range of 30:1–5:1.

Figure 3C:
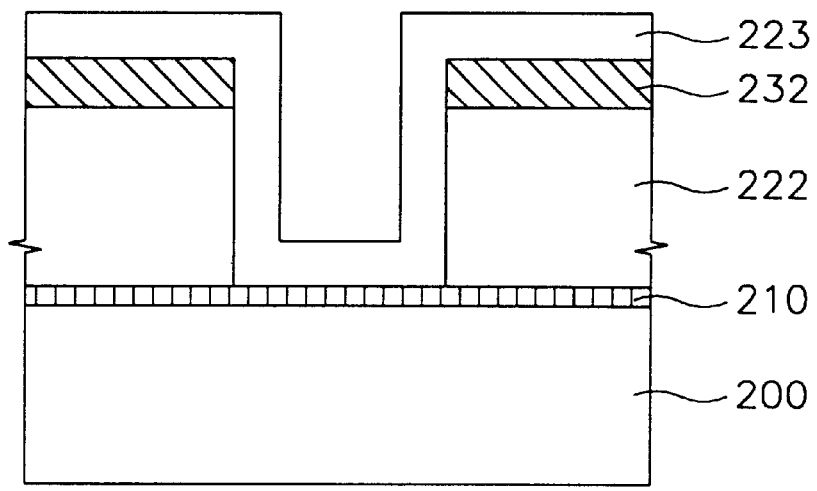

Referring to FIG. 3C, the photoresist pattern 242 is removed by a strip process. Then, $SiO_2$ is deposited in the opening created by the prior etching process of FIG. 3B, namely along the first nitride layer 210 and the second nitride layer pattern 232 to a thickness of about 2500 Å, to form a second $SiO_2$ pattern 223 on the $SiO_2$ pattern 222. The $SiO_2$ patterns 222 and 223 are formed from the same material.

Figure 3D:
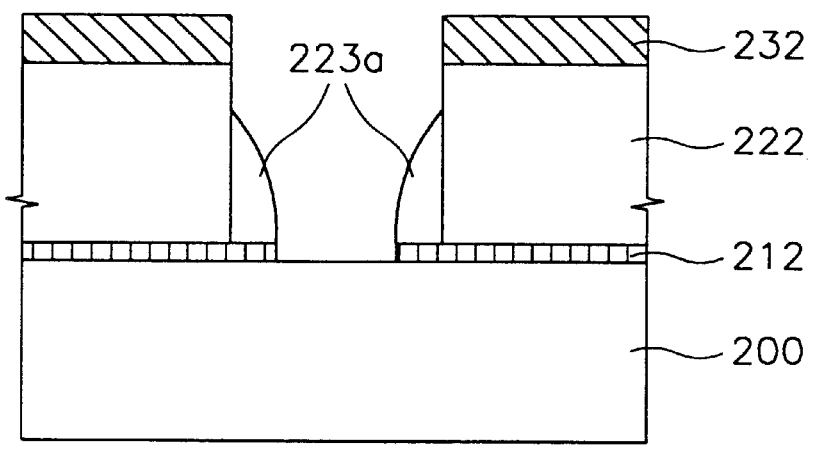

Referring to FIG. 3D, an etch back process is implemented with respect to the second $SiO_2$ pattern 223 until the first nitride layer 210 and the second nitride layer pattern 232 are exposed, to form a sacrificial spacer 223a to a predetermined thickness on the side wall of the $SiO_2$ pattern 222. Note that the sacrificial spacer 223a and the $SiO_2$ pattern 222 are formed from the same material. Since the width of the gate electrode is determined by the thickness (i.e., width) of the spacer, the size of the transistor can be controlled by controlling the amount of oxide deposited and the degree of the etch back during the process steps illustrated in FIGS. 3C & 3D.

An exposed portion of the first SiN layer 210 between the sacrificial spacer 223a is removed by utilizing nitride and phosphoric acid to form a SiN layer pattern 212. At the same time, the second SiN layer pattern 232 is also partially removed. However, since the second SiN layer pattern 232 is thicker relative to the first SiN layer 210, only a small upper portion of the second SiN layer pattern 232 is removed, leaving most of the second SiN layer 232 remaining intact.

Figure 3E:
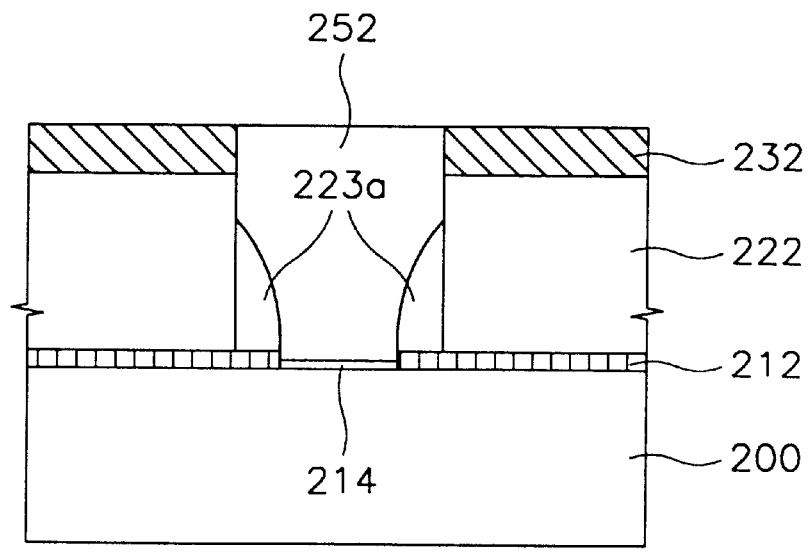

Referring to FIG. 3E, a thin gate oxide layer 214 is formed by a thermal oxidation method on the exposed portion of the substrate 200 between the sacrificial spacer 223a. Then, polysilicon is deposited on the substrate. The deposited polysilicon is planarized, for example, by implementing a CMP process using the second SiN layer 232 as an etch stopping layer to obtain the basic structure of the gate electrode 252.

Figure 3F:
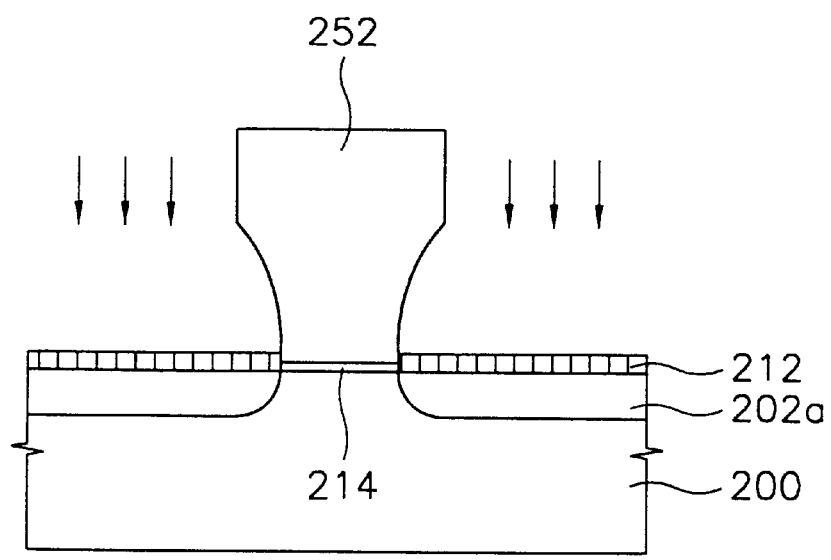

Referring to FIG. 3F, the second SiN layer 232, the $SiO_2$ layer pattern 222 and the sacrificial spacer 223a are removed by a wet etching method, leaving a gate electrode 252 structure with an upper portion that is wider (i.e., horizontal width) than a lower portion. The SiN layer 232 is removed by a strip process utilizing phosphoric acid ($H_3PO_4$), which has an etching selectivity of SiN with respect to $SiO_2$ of about 100:1. The $SiO_2$ layer pattern 222 is removed by utilizing a wet etching method, which has an etching selectivity of $SiO_2$ with respect to polysilicon of about 50:1. For the wet etching solution, LAL (which is a mixture of ammonium fluoride ($NH_4F$) and hydrogen fluoride), BOE (buffered oxide etchant), and the like can be utilized.

A lightly-doped region 202a is formed by implementing a doping process with an impurity having a low concentration and by utilizing the gate electrode 252 formed by the above-described method as a mask. The ion doping angle can be set to a predetermined degree according to the equipment and the process. For example, the ion doping can implemented from a vertical direction, that is, perpendicular to the substrate, as illustrated in FIG. 3F.

Figure 3G:
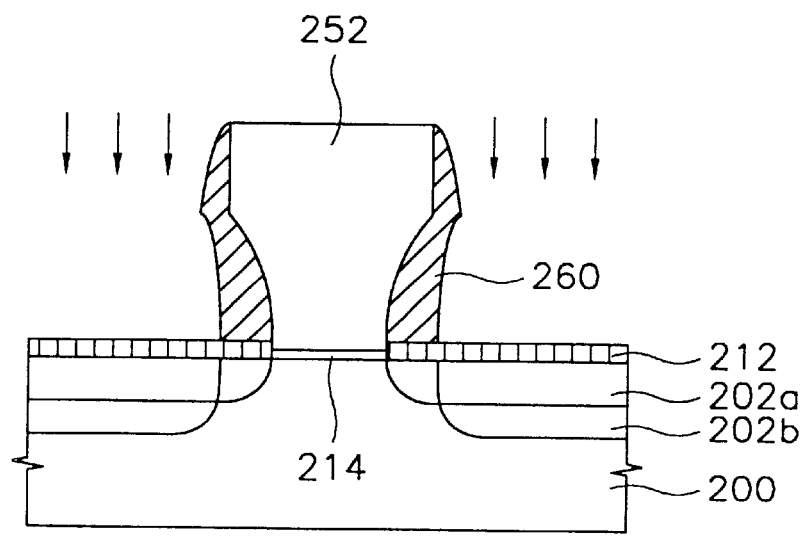

Referring to FIG. 3G, after the formation of the lightly-doped region 202a, SiN is deposited and then an etch back process is implemented until an active region of the substrate is exposed to form a spacer 260 along the side wall of the gate electrode 252, from the upper portion to the lower portion thereof. The spacer 260 conforms to the varying shape of the gate electrode 252, as illustrated in FIG. 3G. Thereafter, a heavily-doped region (an impurity doped region of high concentration) 202b is formed by doping an impurity having a high concentration and by utilizing the spacer 260 as a mask. Since the spacer 260 functions as the mask, the ion doping can be implemented from the vertical direction with respect to the substrate as illustrated in FIG. 3G. However, the doping angle can be varied according to the equipment and the process to optimize the process.

Figure 3H:
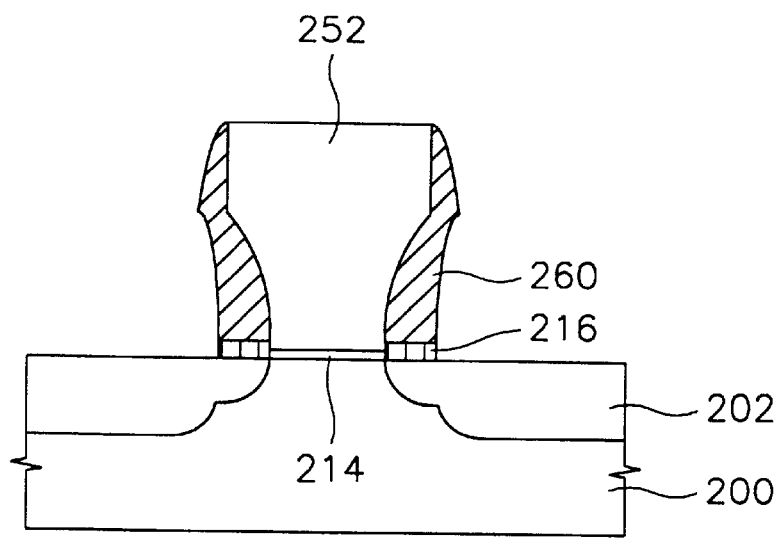
Figure 31:
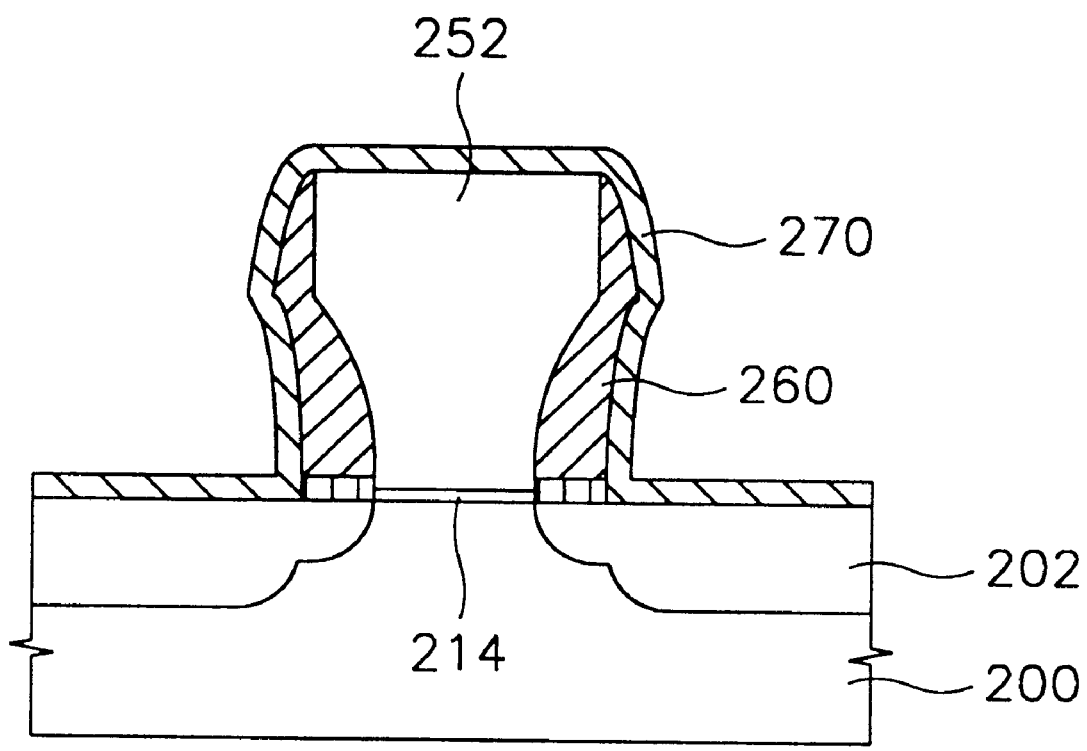

Referring to FIG. 3H, the exposed portion of the SiN layer pattern 212 formed on the substrate is removed, leaving a SiN layer 216 underlying the spacer 260 and interposed between the spacer 260 and the substrate 200. This process can be implemented by a wet etching method utilizing a phosphoric acid solution. When implementing the wet etching, a small portion of the SiN layer of the spacer 260 may also be etched. However, the SiN spacer 260 is thicker, relative to the SiN layer pattern 212, so only a trace portion of the spacer 260 is removed and most of the spacer 260 remains intact.

Referring to FIG. 3I, a metal layer 270 is formed on the gate electrode 252 and the substrate 200 by depositing a metal such as cobalt. When metal compounds such as Ti, Ni, Co, etc. are deposited on a layer containing a silicon atom, and a heat treatment process is then performed, a silicide compound such as Ti-silicide, Ni-silicide or Co-silicide is formed by the interaction. Accordingly, a heat treatment process is implemented at a temperature range of about 700–900° C. to transform the metal into metal silicide at those portions where the underlying layers contain silicon. Through the heat treatment, CoSix layers, preferably $CoSi_2$ layer 254 and 218, are formed to thereby obtain the transistor as illustrated in FIG. 2.

The salicidation process, which is applied to improve the device speed by lowering the resistance around a transistor or a contact hole, will now be explained in more detail. The salicidation process is generally implemented by depositing a metal such as Co or Ti on the surface of the substrate on which the transistor is formed, implementing a first salicidation step a selective etching step and a second salicidation step. A stable silicide compound is formed by depositing cobalt or titanium and then heat treating at about 650° C. When applying the heat treatment to form the silicide compound, the salicidation process should be implemented two times in order to prevent an electric short between the gate-source-drain of the transistor.

First, an upper portion of a semiconductor substrate, on which a gate electrode, a spacer and an impurity doped region are formed, is removed by an RF sputtering process to about 50 Å. This step is implemented to remove an oxide formed on the surface of the substrate because Co is sensitive to the surface condition. Then, Co or Ti is deposited on the whole surface of the substrate to form a Co or Ti layer.

In the first salicidation step, a heat treatment is implemented for about 90 seconds at about 480° C. to form a CoSi or TiSi compound layer at the upper portion of a layer including silicon, such as an exposed impurity doped region and the silicon oxide layer of the gate electrode. The deposited metal which does not form the metal silicide compound remains at the portion where no silicon is included in the underlying layer. This remaining metal is removed by a selective etching utilizing deionized water, hydrogen sulfoxide, etc, while the silicide compound remains. Then, a second salicidation step is implemented by a heat treatment at about 700–900° C., more preferably at about 850° C. for about 30 seconds, to form a silicon compound layer such as $CoSi_2$ or $TiSi_2$ around the transistor and the contact hole.

According to the above-described embodiment, metal silicide is formed at the upper portion of the gate electrode (254, see FIG. 2) and the exposed portion of the substrate (218, see FIG. 2). The metal silicide layer 254 has a predetermined thickness, therefore, the height H of the gate electrode must take into consideration the metal silicide layer. Through repeated experiments, it was found that the preferred height of the gate electrode is at least about 1500 Å in order to manufacture a transistor having good characteristics.

The transistor manufactured by the above-described embodiment utilizes the salicidation process. The salicidation process is applicable for mass production and has been commonly applied for the manufacture of devices including a gate electrode, especially those with a width of about 0.13 µm or less, in order to lower the resistance. The gate electrode of this inventive transistor, which has a very minute critical dimension, also has a larger upper area for the formation of the metal silicide compound. Accordingly, the gate electrode has a sufficiently wide upper area for the formation of the metal silicide compound while providing a transistor having a decreased size at the lower area. This structure decreases the defects in a device caused by cutting the minute metal silicide pattern. In addition, the resistance of the gate electrode can be advantageously decreased.

According to the above-described embodiment as illustrated in FIGS. 3A–3I, a separate SiN layer is formed on the oxide layer to function as the etch stopping layer, which is utilized for the implementation of the CMP process. However, when an etch back process is implemented by a planarization method instead of the CMP process, this etch stopping layer is unnecessary.

FIGS. 4A–4G are schematic cross-sectional views for explaining a method of manufacturing the transistor illustrated in FIG. 2 according to a second embodiment of the present invention.

Figure 4A:
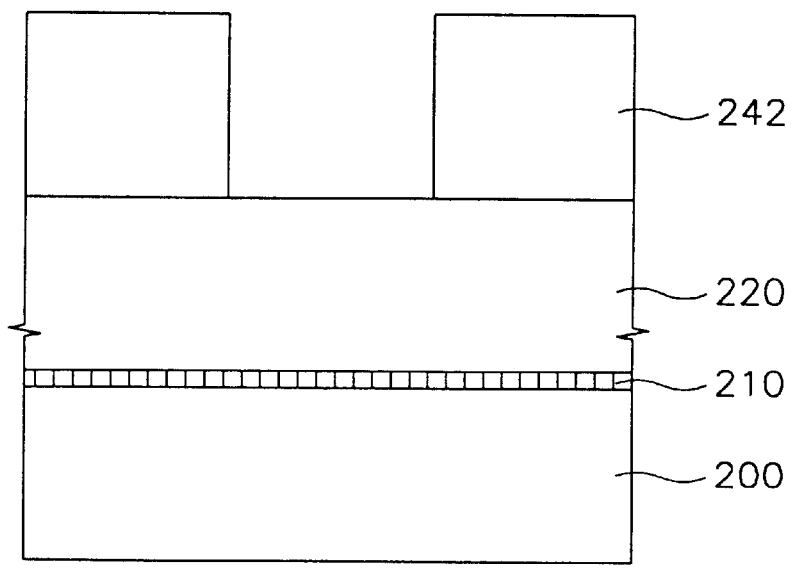
FIGS. 4A–4G are schematic cross-sectional views for explaining a second method of manufacturing the transistor illustrated in FIG. 2 according to an embodiment of the present invention.

Referring to FIG. 4A, a nitride layer 210 and an oxide layer 220 are formed on a substrate 200 by sequentially depositing a nitride compound such as SiN and an oxide compound such as silicon oxide, HTO, $Al_2O_3$, etc., preferably $SiO_2$. Preferably, an SiN layer 210 having a thickness in a range of about 50–200 Å and an $SiO_2$ layer 220 having a thickness in a range of 1000–4000 Å, are formed. On the $SiO_2$ layer 220, a photoresist is coated and a photoresist pattern 242 having a predetermined shape is formed by a photolithography process.

Figure 4B:
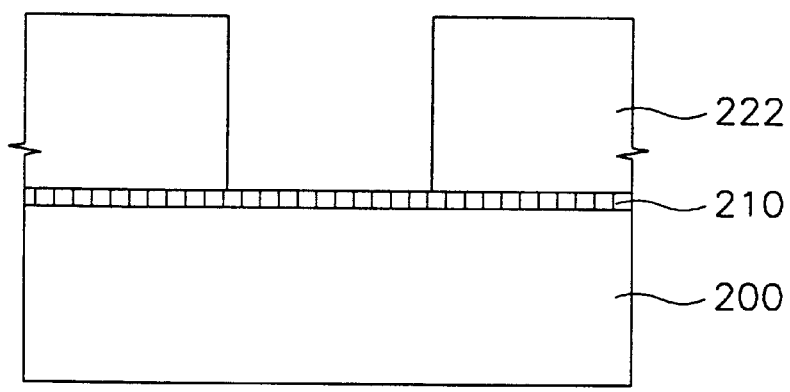

Referring to FIG. 4B, an $SiO_2$ pattern 222 is formed by etching the $SiO_2$ layer 220 and using the photoresist pattern 242 as a mask. To prevent the SiN layer 210 from being etched, a dry etching process is employed, using an etching gas such as $C_4F_8$/Ar/CO so as to control the etching selectivity of SiN with respect to $SiO_2$ is in a range of 30:1–5:1. Then, the photoresist pattern 242 is removed by implementing a strip process.

Figure 4C:
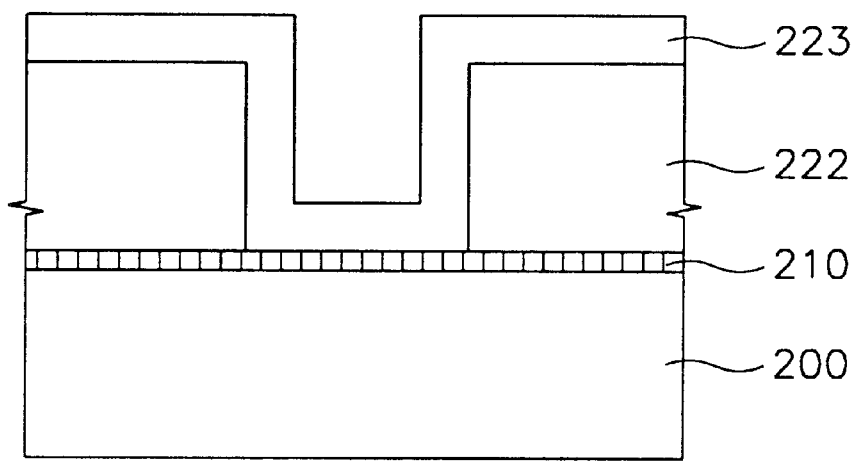

Referring to FIG. 4C, $SiO_2$ is deposited on the $SiO_2$ pattern 222 and the SiN layer 210 to a thickness of about 2500 Å to form a second $SiO_2$ pattern 223 on the $SiO_2$ pattern 222 formed through the etching process illustrated in FIG. 4B. These two $SiO_2$ patterns are formed from the same material.

Figure 4D:
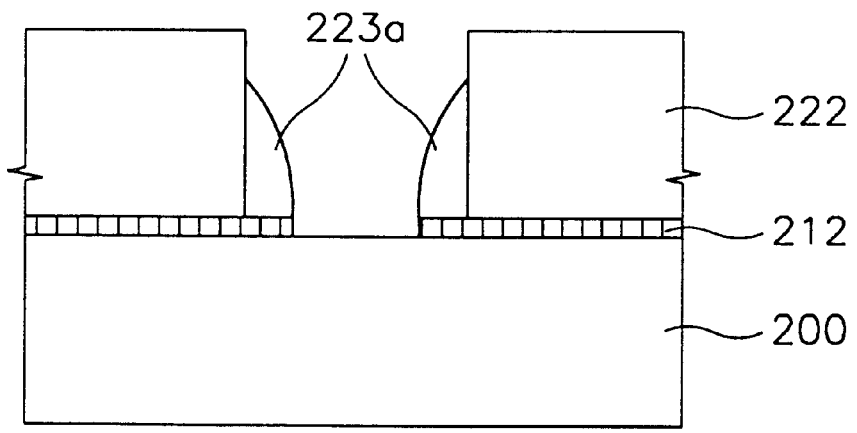

Referring to FIG. 4D, an etch back process is implemented with respect to the second $SiO_2$ pattern 223 until the active region of the substrate 200 is exposed to form a sacrificial spacer 223a to a predetermined thickness on the side wall of the $SiO_2$ pattern 222. Since the width of the gate electrode is determined by the thickness of the sacrificial spacer 223a, the size of the transistor can be controlled by controlling the amount of oxide deposited and the degree of the etch back during implementing the steps illustrated in FIG. 4C. An exposed portion of the first SiN layer 210, between the sacrificial spacer 223a, is removed by utilizing nitride and phosphoric acid to form a SiN layer pattern 212.

Figure 4E:
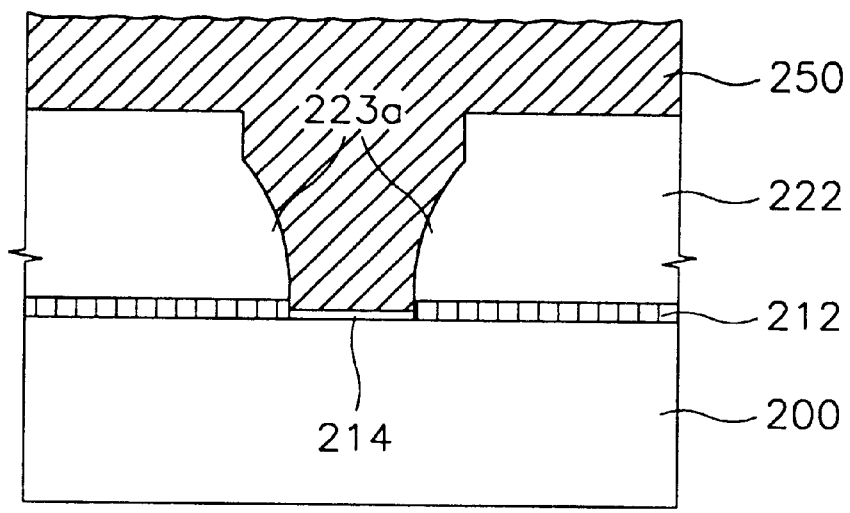

Referring to FIG. 4E, a thin gate oxide layer 214 is formed by a thermal oxidation method on the exposed portion of the substrate 200 between the sacrificial spacer 223a. Then, polysilicon 250 is deposited on the substrate 200.

Figure 4F:
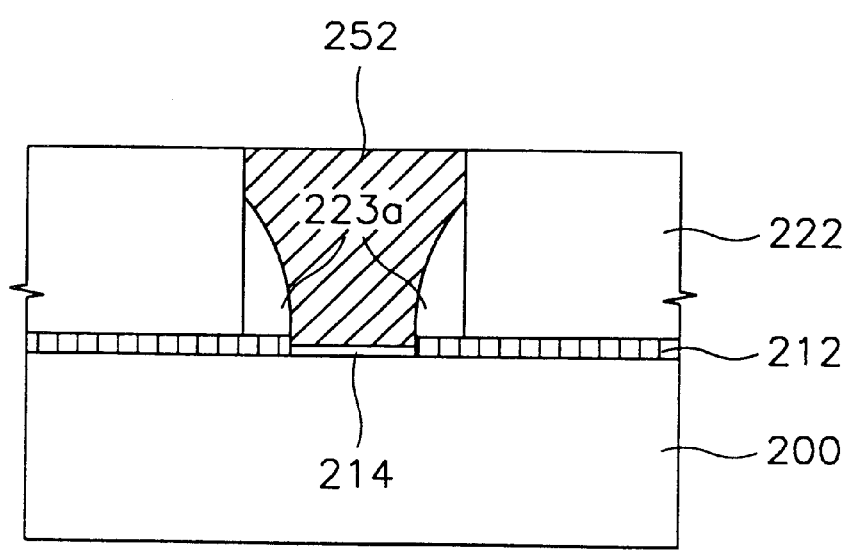

Referring to FIG. 4F, the deposited polysilicon 250 and even the $SiO_2$ pattern 222, if necessary, are planarized by implementing an etch back process until a desired thickness of an electrode is obtained, which creates the basic structure of the gate electrode 252. According to the present invention, the height H of the gate electrode (see FIG. 2) should be about 1500 Å, and accordingly, the etch back process is implemented for the requisite time period to achieve the desired result.

Figure 4G:
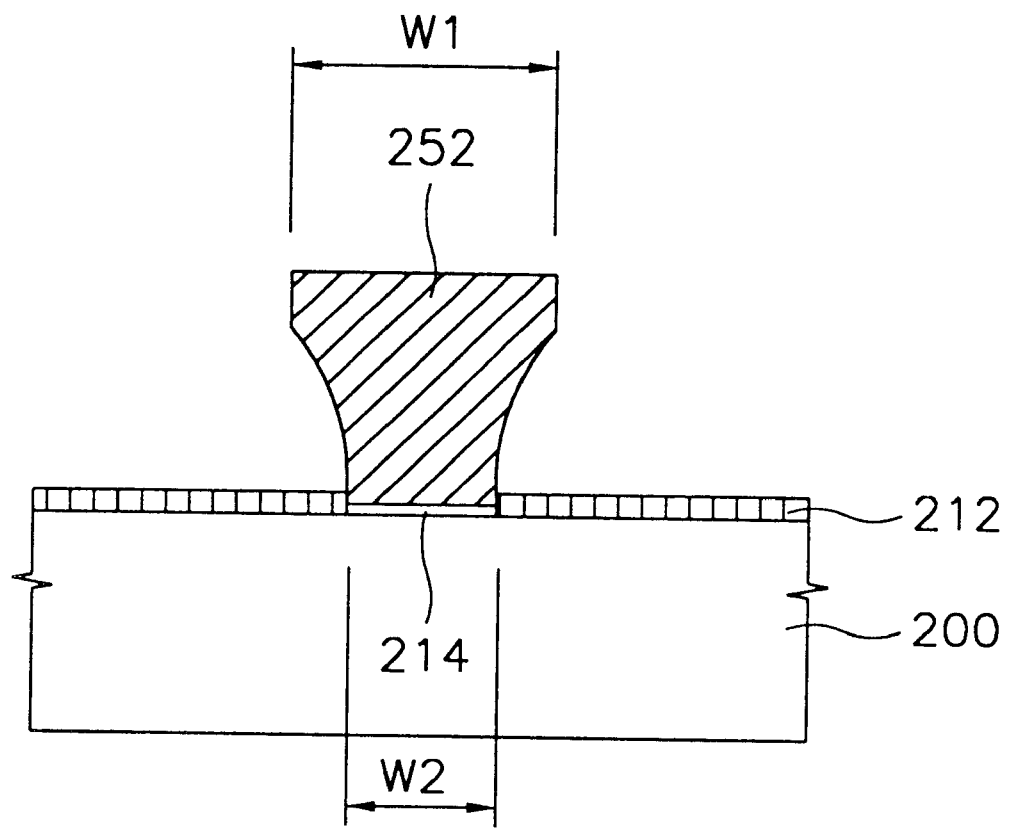

Referring to FIG. 4G, the $SiO_2$ layer pattern 222 and the sacrificial spacer 223a are removed by a wet etching method to obtain the gate electrode 252 structure with an upper portion having a horizontal width W1 that is greater than a horizontal width W2 of the lower portion. The SiO$_2$ layer is removed by utilizing a wet etching method, in which the etching selectivity of SiO$_2$ with respect to polysilicon is about 50:1. As for the wet etching solution, LAL and BOE, and the like can be utilized.

The gate electrode manufactured by the above-described process has an upper portion that is wider than a lower portion, as illustrated in FIG. 3F. Afterward, the transistor illustrated in FIG. 2 can be manufactured by implementing the same procedure illustrated in FIGS. 3G–3I.

Since the gate electrode has an upper portion that is wider than a lower portion, a stable device having a minute critical dimension can be manufactured, through an application of the transistor manufactured by the present invention and including the gate electrode. Further, a transistor can be advantageously manufactured by utilizing the structure of the gate electrode according to the present invention.

Because the gate electrode manufactured by the first and second embodiments has an upper portion that is wider than a lower portion, both low concentration and high concentration ion doping processes can be implemented without a separate spacer formed on the side wall of the gate electrode. Accordingly, when the metal silicide compound is not formed on the upper portion of the gate electrode and on the exposed portion of the substrate, a transistor having a LDD structure can be advantageously manufactured by controlling the ion doping angle without the spacer on the side wall of the gate electrode.

Figure 5A:
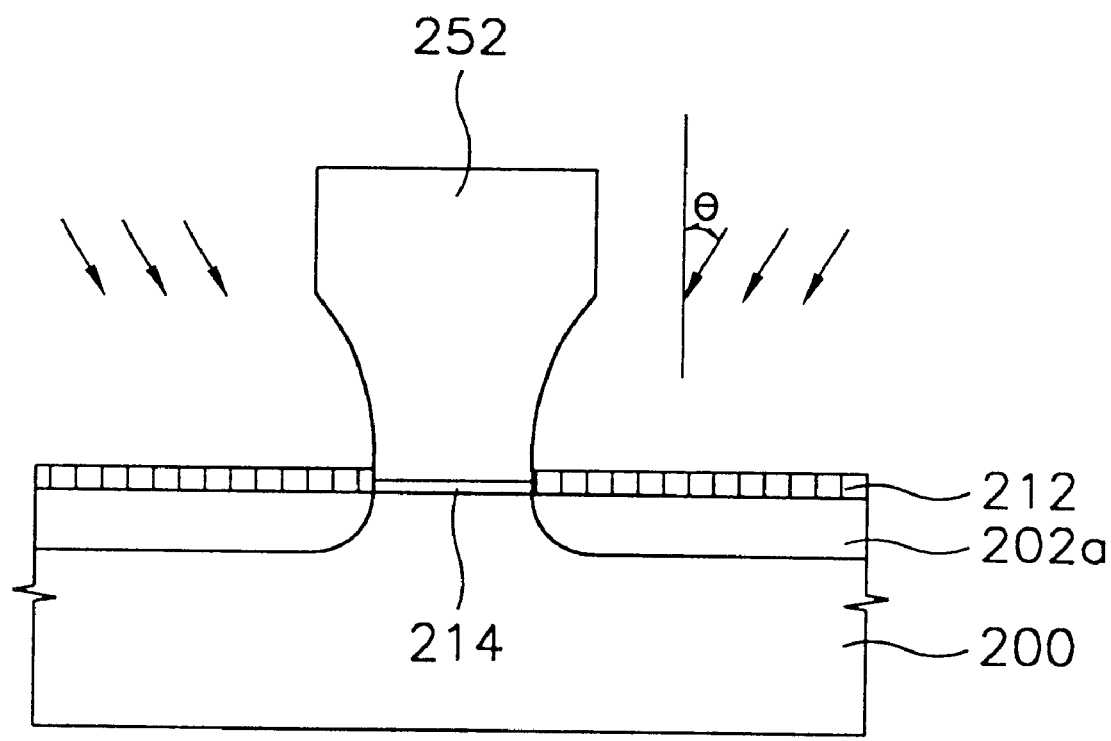
FIGS. 5A–5C are schematic cross-sectional views for explaining a third method of manufacturing a transistor according to another embodiment of the present invention.
Figure 5B:
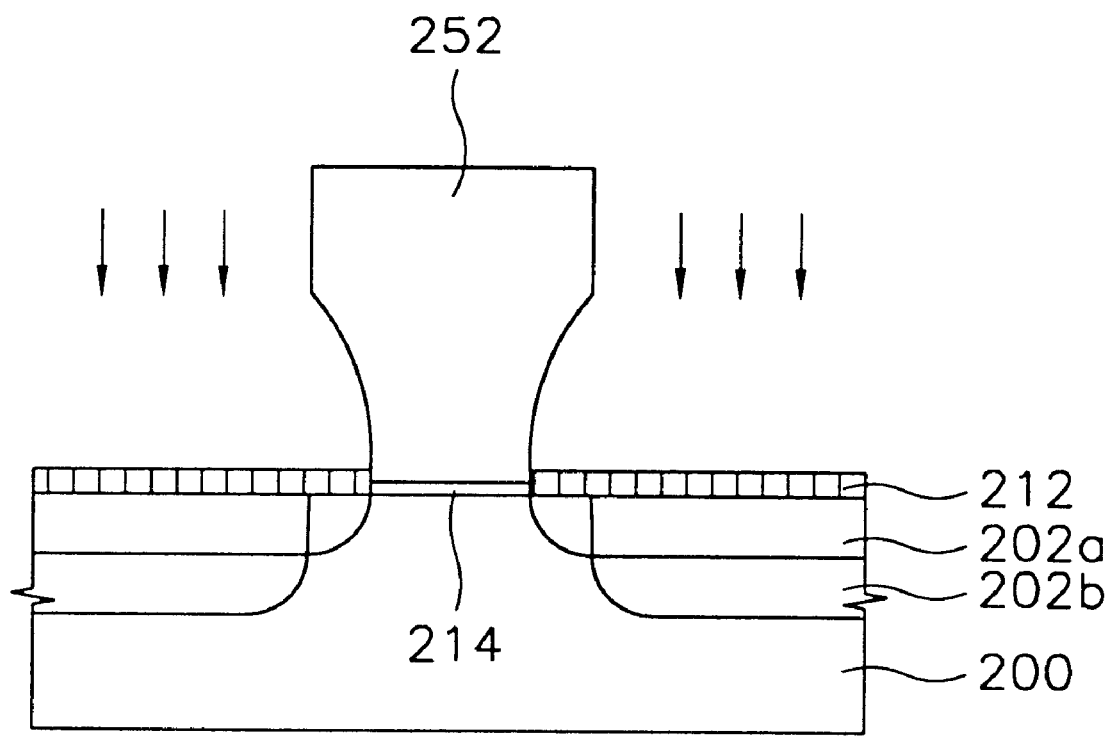
Figure 5C:
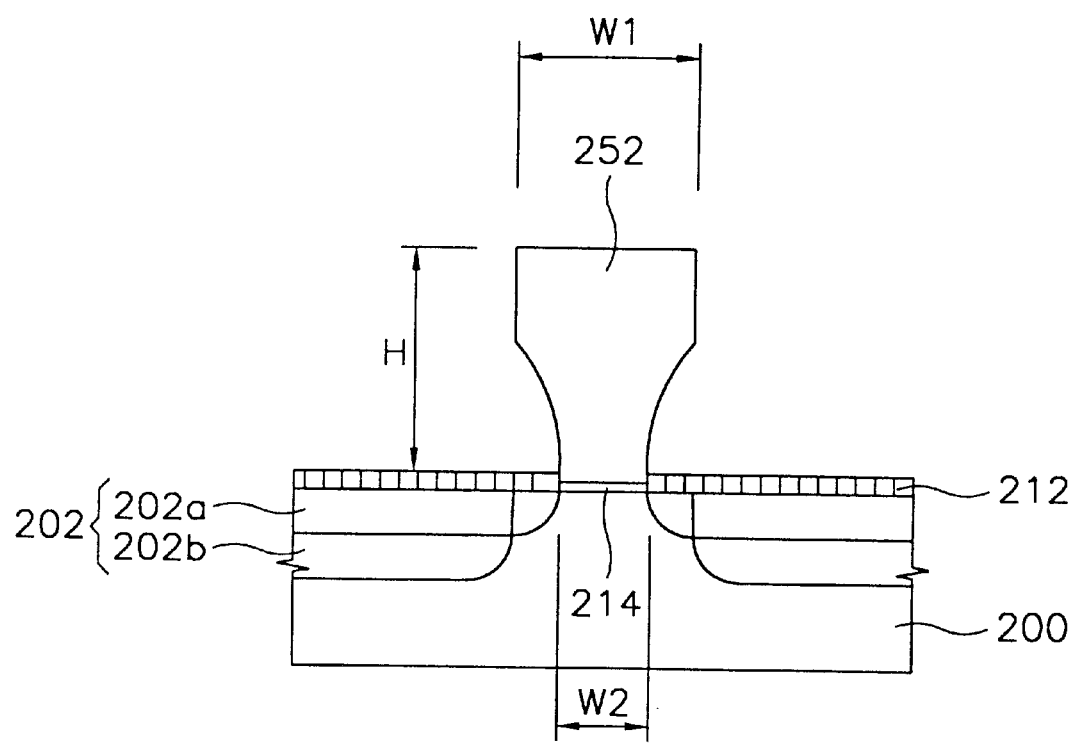

FIGS. 5A–5C are schematic cross-sectional views for explaining a method of manufacturing a transistor according to a third embodiment of the present invention.

Referring to FIG. 5A, a gate electrode 252 having a basic structure is obtained by implementing the same procedure illustrated in FIGS. 3A–3E and then removing the second nitride pattern 232 and the SiO$_2$ pattern 222 by a wet etching method.

Thereafter, an ion doping process is implemented by doping an impurity of low concentration with a slightly inclined ion doping angle θ with respect to a vertical line of the substrate as illustrated in FIG. 5A, for example, ±7° with respect to a vertical line perpendicular to the substrate, to form a lightly-doped region 202a.

Referring to FIG. 5B, an ion doping process is implemented without any inclination with respect to a vertical line perpendicular to the substrate, that is, with an ion doping angle θ of 0°, to form a heavily-doped region 202b within a narrower region than the lightly-doped region 202a according to the structure of the gate electrode 252.

Referring to FIG. 5C, a cross-sectional view of a transistor of an LDD structure manufactured by implementing the above-described ion doping processes is illustrated. A gate oxide layer 214 and a SiN pattern layer 212 are formed on a substrate 200, and the gate electrode 252 is formed on the gate oxide layer 214. The upper width W1 of the gate electrode 252 is wider than the lower width W2 thereof. The preferred ratio of the width W1 of the upper portion to the width W2 of the lower portion of the gate electrode is in a range of about 1.3–2.5:1. Also, the width W2 of the lower portion of the gate electrode is about 0.13 μm or less, therefore, a minute electrode can be manufactured by this method. The height H of the gate electrode is in a range of about 1500–2500 Å.

At the upper portion of the substrate 200 and at the left and right sides of the gate electrode 252, an impurity doped region 202, including a lightly-doped region 202a and a heavily-doped region 202b, are formed to obtain a transistor structure.

As described above, the transistor according to the present invention has a minute critical dimension and can be applied to ensure a stable device is manufactured. The inventive transistor enables high speed CPU products, or efficient SRAM products.

In particular, when a metal silicide compound is formed on the upper portion of the gate electrode having a minute critical dimension in order to decrease a resistance, the increased area of the upper portion of the gate electrode prevents the cutting of the metal silicide compound, and thus ensures the manufacture of a stable transistor.

In addition, according to the present invention, a transistor can be advantageously manufactured by applying only one photolithography process, therefore, the number of masks can be reduced to save cost and processing time.

While the present invention is described in detail referring to the attached embodiments, various modifications, alternate constructions and equivalents may be employed without departing from the true spirit and scope of the present invention.

What is claimed is:

1. A transistor comprising:

a substrate;

a gate electrode formed on a horizontal surface of said substrate, said gate electrode having an upper portion and a lower portion, wherein a vertical side-wall of said lower portion is concave, and wherein a horizontal width of said upper portion is greater than a horizontal width of said lower portion;

a spacer formed on a side wall of said gate electrode from said upper portion to said lower portion thereof;

a first impurity doped region formed at an upper portion of said substrate; and a second impurity doped region underlying said first impurity doped region, wherein said second impurity doped region has an impurity concentration higher than said first impurity doped region, and wherein said second impurity doped region is narrower than said first impurity doped region.

2. A transistor as claimed in claim 1, wherein the ratio of the horizontal width of said upper portion to the horizontal width of said lower portion of said gate electrode is in a range of about 1.3–2.5:1.

3. A transistor as claimed in claim 1, wherein the horizontal width of said lower portion of said gate electrode is no greater than about 0.13 μm.

4. A transistor as claimed in claim 1, wherein a height of said gate electrode is in a range of about 1500–2500 Å.

5. A transistor as claimed in claim 1, further comprising a metal silicide compound formed on said gate electrode and said substrate.

6. A transistor as claimed in claim 1, wherein said spacer includes a bottom surface facing said horizontal surface of said substrate, and said transistor further comprising a nitride layer interposed between said bottom surface of said spacer and said horizontal surface of said substrate.

7. A method of manufacturing a transistor comprising:

providing a substrate;

forming a gate electrode on a horizontal surface of said substrate, said gate electrode having an upper portion and a lower portion, wherein a vertical side-wall of said lower portion is concave, and wherein a horizontal width of said upper portion is greater than a horizontal width of said lower portion;

forming a first impurity doped region in said substrate by doping a first impurity having a low concentration and using said gate electrode as a mask;

forming a spacer composed of a nitride compound on a side wall of said gate electrode from said upper portion to said lower portion; and forming a second impurity doped region in said substrate by doping a second impurity having a higher concentration than that of said first impurity, and using said spacer as a mask.

8. A method of manufacturing a transistor comprising:

providing a substrate;

forming a gate electrode on said substrate, said gate electrode having an upper portion and a lower portion, and wherein a horizontal width of said upper portion is greater than a horizontal width of said lower portion;

forming a first impurity doped region in said substrate by doping a first impurity having a low concentration and using said gate electrode as a mask;

forming a spacer composed of a nitride compound on a side wall of said gate electrode from said upper portion to said lower portion; and forming a second impurity doped region in said substrate by doping a second impurity having a higher concentration than that of said first impurity, and using said spacer as a mask;

wherein said forming the gate electrode comprises:

forming, sequentially, a nitride layer, an oxide layer and a photoresist pattern on a substrate;

forming an oxide pattern by etching said oxide layer using said photoresist pattern as a mask, wherein said etching exposes the nitride layer;

forming a sacrificial spacer on a side wall of said oxide pattern;

removing the exposed portion of the nitride layer between the sacrificial spacer to expose said substrate;

forming a thermal oxide layer on the exposed portion of said substrate between the sacrificial spacer;

depositing a polysilicon layer on the whole surface of said substrate and said oxide layer;

planarizing said polysilicon layer; and removing said sacrificial spacer and said oxide layer.

9. A method as claimed in claim 8, wherein said sacrificial spacer is formed by depositing a same material as the oxide layer and implementing an etch back process until said nitride layer is exposed.

10. A method as claimed in claim 8, further comprising forming a nitride pattern after forming said oxide layer and before forming said photoresist pattern, wherein said nitride pattern is formed by depositing another nitride layer on said oxide layer, and after forming said photoresist pattern, then etching said another nitride layer using said photoresist pattern as a mask, and wherein said planarizing process is carried out by a CMP (chemical mechanical polishing) method using said nitride pattern as an etch stopping layer.

11. A method as claimed in claim 10, wherein during said forming said another nitride layer, further comprising selecting one of SiN and SiON for a material for said another nitride layer.

12. A method as claimed in claim 10, wherein an etching selectivity of said another nitride layer with respect to said oxide layer during the forming of said nitride pattern and oxide pattern is in a range of about 30:1–5:1.

13. A method as claimed in claim 8, wherein said planarizing process is carried out by an etch back method until said polysilicon reaches a predetermined thickness.

14. A method as claimed in claim 8, wherein during said forming of said oxide layer, further comprising selecting a material for said oxide layer from a group consisting of $SiO_2$, HTO and $Al_2O_3$.

15. A method as claimed in claim 7, wherein after forming a second impurity doped region, further comprising:

depositing at least one metal selected from the group consisting of Co, Ti and Ni on said substrate and said gate electrode to form a metal layer; and implementing a heat treating process on said metal layer to form a metal silicide region on said gate electrode and said substrate.

16. A method as claimed in claim 7, wherein during said forming of said gate electrode, the horizontal width of said lower portion of said gate electrode is no greater than about 0.13 $\mu$m.

17. A method as claimed in claim 16, wherein during said forming of said gate electrode, a ratio between the horizontal width of said upper portion to the horizontal width of said lower portion of said gate electrode is in a range of about 1.3–2.5:1.

18. A method of manufacturing a transistor comprising:

forming, sequentially, a nitride layer, an oxide layer and a photoresist pattern on a substrate;

forming an oxide pattern by etching said oxide layer using said photoresist pattern as a mask, wherein said etching exposes the nitride layer;

forming a sacrificial spacer on a side wall of said oxide pattern;

removing the exposed portion of the nitride layer between the sacrificial spacer to expose said substrate;

forming a thermal oxide layer on the exposed portion of said substrate between the sacrificial spacer;

forming a polysilicon layer by depositing polysilicon on a whole surface of said substrate;

planarizing said polysilicon layer;

forming a gate electrode having an upper portion and a lower portion, by removing said sacrificial spacer and said oxide layer, wherein a horizontal width of the upper portion is greater than a horizontal width of a lower portion;

doping a first impurity in said substrate at an angle which is offset from a direction perpendicular to a surface of the substrate, using said gate electrode as a mask; and doping a second impurity in said substrate having a higher concentration than that of the first impurity, at an angle which is coincident with the direction perpendicular to the surface of the substrate, using said gate electrode as a mask.

19. A method as claimed in claim 18, wherein during said doping of the first impurity, said predetermined angle is ±7°.

20. A method as claimed in claim 18, further comprising:

forming a spacer on a side wall of said gate electrode from the upper portion to the lower portion thereof, after said doping said first impurity and before said doping said second impurity;

depositing at least one metal selected from the group consisting of Co, Ti and Ni on said substrate and said gate electrode to form a metal layer; and implementing a heat treating process on said metal layer to form a metal silicide region on said gate electrode and said substrate.

* * * * *